(12) United States Patent
Lee et al.

(10) Patent No.: US 12,181,504 B2
(45) Date of Patent: Dec. 31, 2024

(54) APPARATUS AND METHOD FOR INSPECTING ELECTROSTATIC CHUCK

(71) Applicant: SEMES CO., LTD., Chungcheongnam-do (KR)

(72) Inventors: Su Hyung Lee, Gyeonggi-do (KR); Ga Yeon Kim, Gyeonggi-do (KR); Sung Ho Lee, Gyeonggi-do (KR); Ju Yong Jang, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 285 days.

(21) Appl. No.: 17/859,000

(22) Filed: Jul. 7, 2022

(65) Prior Publication Data

US 2023/0032518 A1 Feb. 2, 2023

(30) Foreign Application Priority Data

Jul. 13, 2021 (KR) .................. 10-2021-0091872

(51) Int. Cl.
*G01R 27/26* (2006.01)
*G01R 31/56* (2020.01)
*H01J 37/32* (2006.01)
*H01L 21/683* (2006.01)

(52) U.S. Cl.
CPC ......... *G01R 27/2605* (2013.01); *G01R 31/56* (2020.01); *H01J 37/32715* (2013.01); *H01L 21/6833* (2013.01); *H01J 2237/2007* (2013.01); *H01J 2237/24592* (2013.01); *H01L 21/6831* (2013.01)

(58) Field of Classification Search
None
See application file for complete search history.

(56) References Cited

U.S. PATENT DOCUMENTS 9,689,825 B1 * 6/2017 Lim ................. G01N 27/24
2011/0199093 A1 * 8/2011 Fujisawa ............ H01L 21/6833
324/537

FOREIGN PATENT DOCUMENTS

| KR | 10-0839607 | 6/2008 |
| KR | 10-2011-0086046 | 7/2011 |
| KR | 10-2019-0022339 | 3/2019 |
| KR | 10-2020-0083278 | 7/2020 |

* cited by examiner

*Primary Examiner* — Amy He

(74) *Attorney, Agent, or Firm* — Womble Bond Dickinson (US) LLP

(57) ABSTRACT

An apparatus and a method for non-destructive inspection of quality of an electrostatic chuck are disclosed. The apparatus includes a measurement unit for measuring a first capacitance of a dielectric layer of the electrostatic chuck and for measuring a second capacitance of an electrode installed in the dielectric layer; and a control unit configured to evaluate quality of the electrode, based on the first capacitance and the second capacitance.

20 Claims, 11 Drawing Sheets

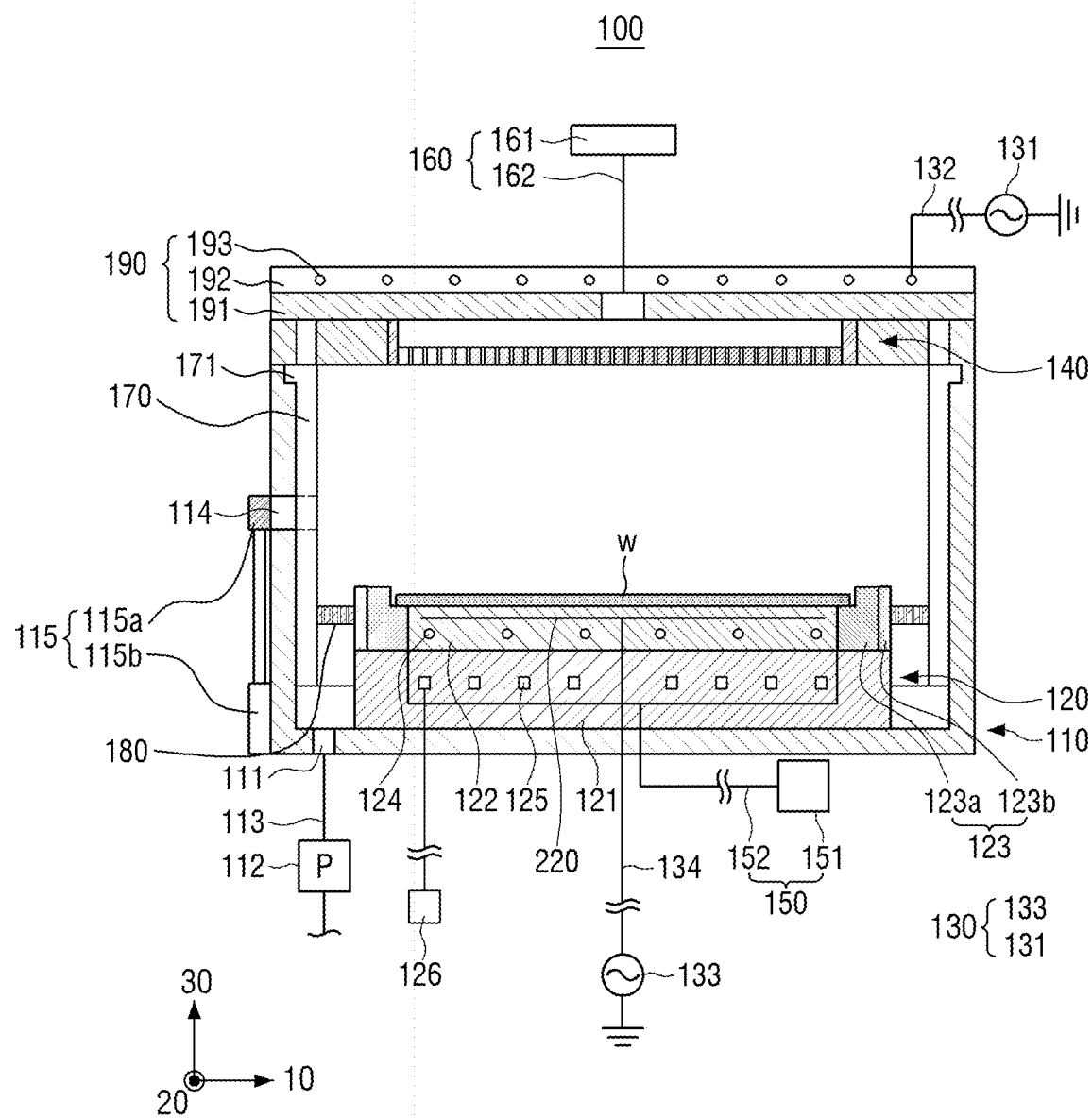
[FIG. 1]

[FIG. 2]
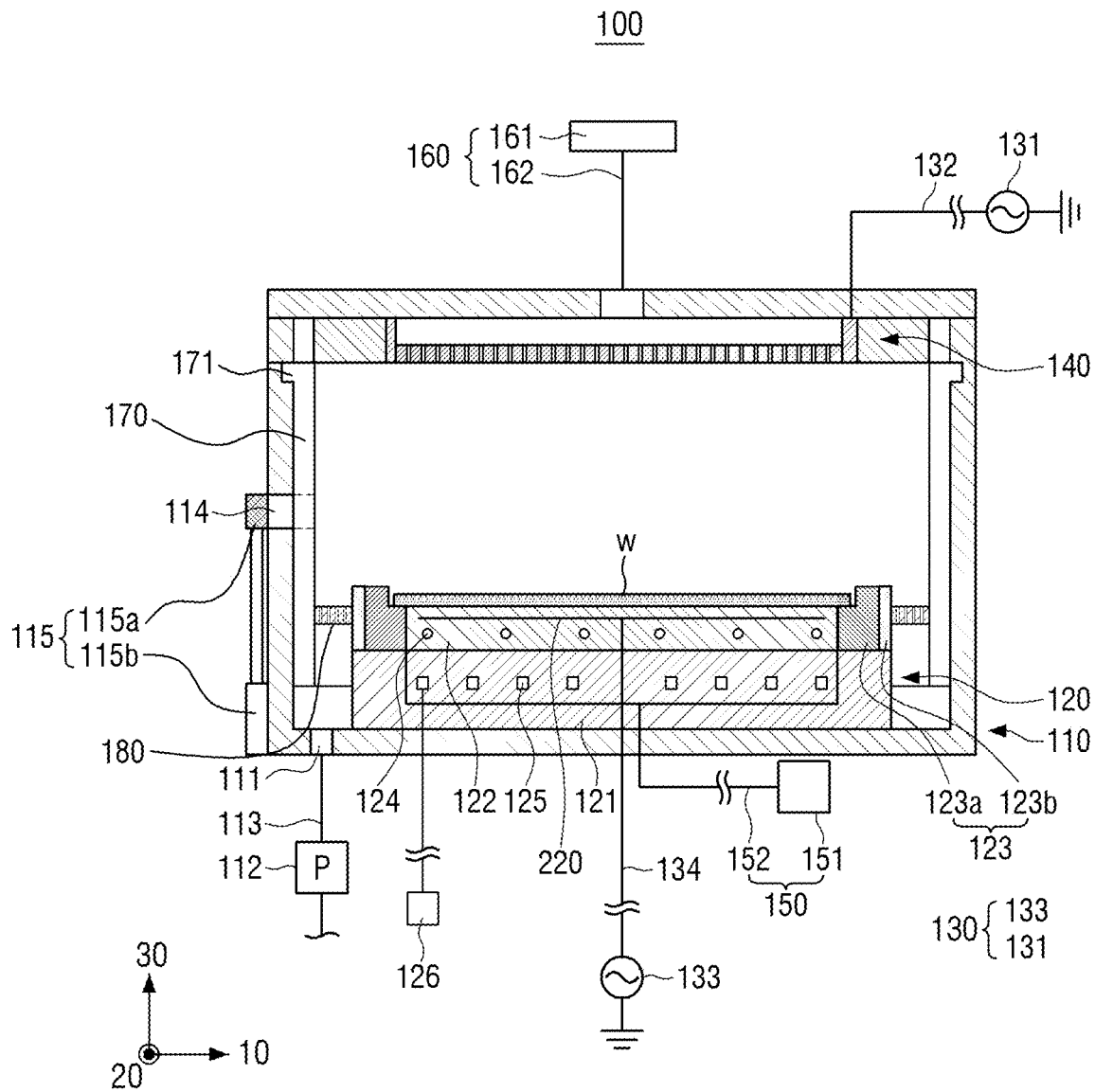

[FIG. 3]
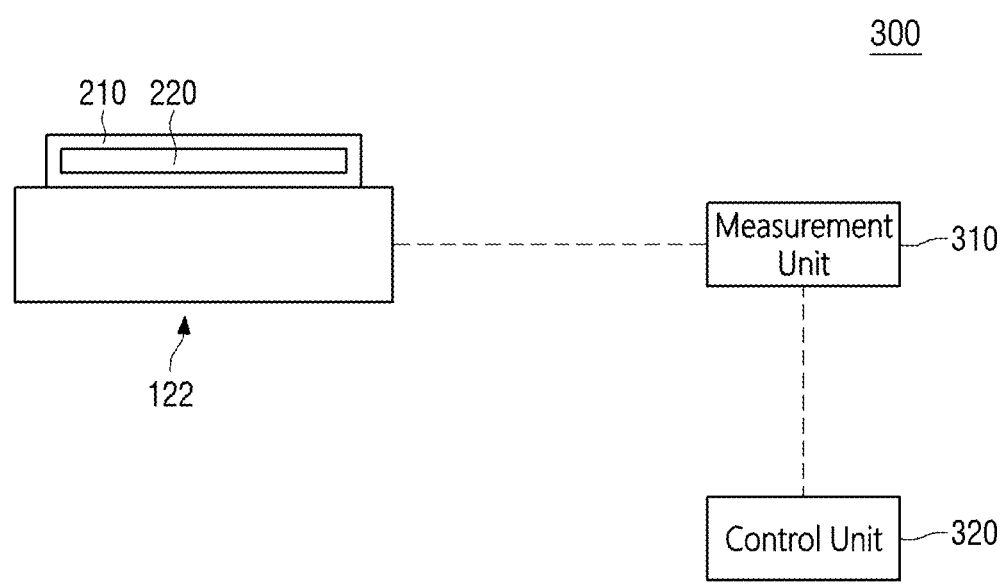

[FIG. 4]
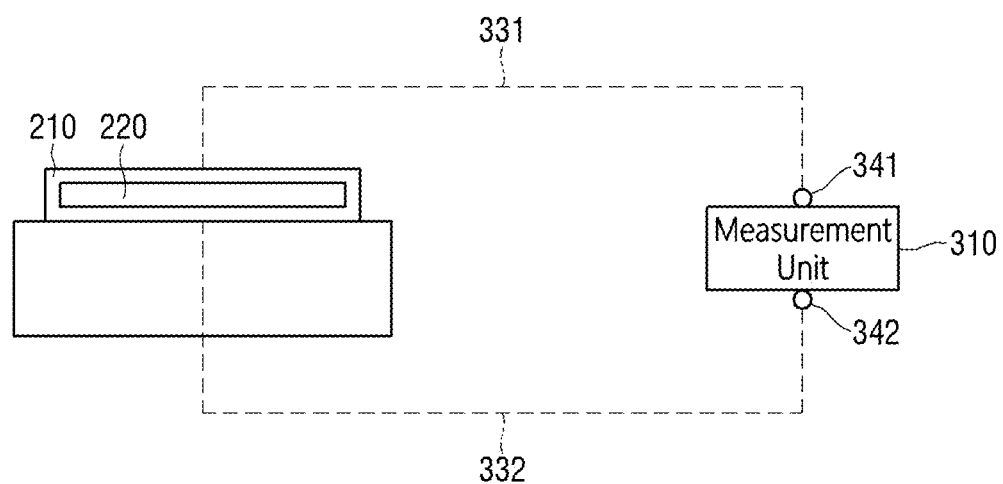

[FIG. 5]
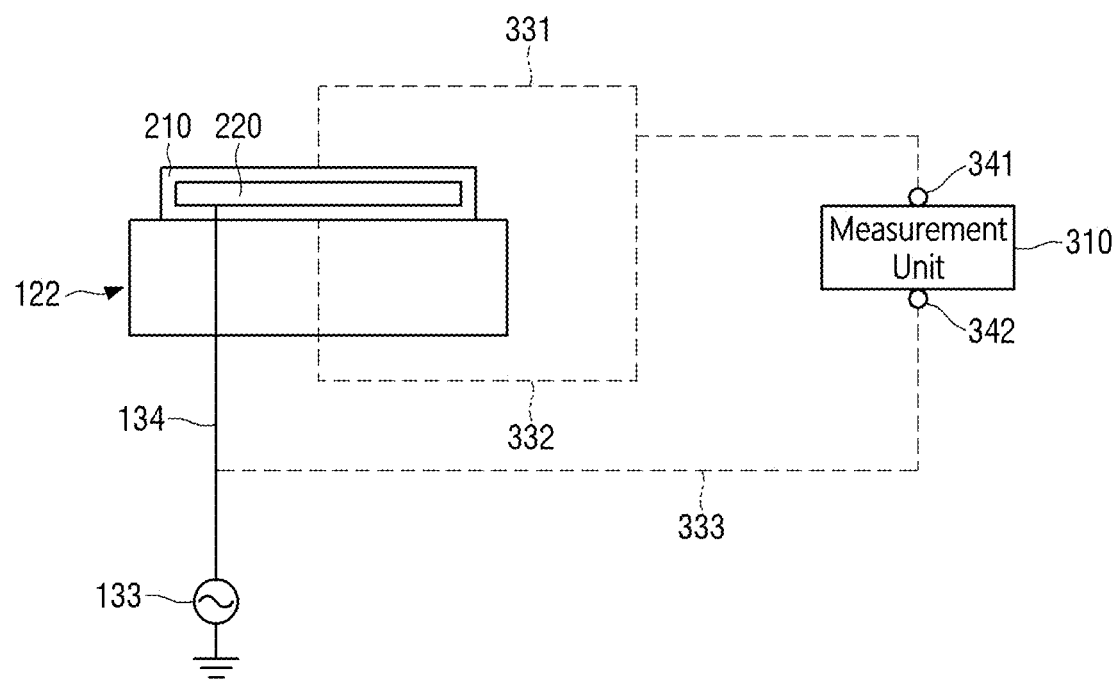

[FIG. 6]
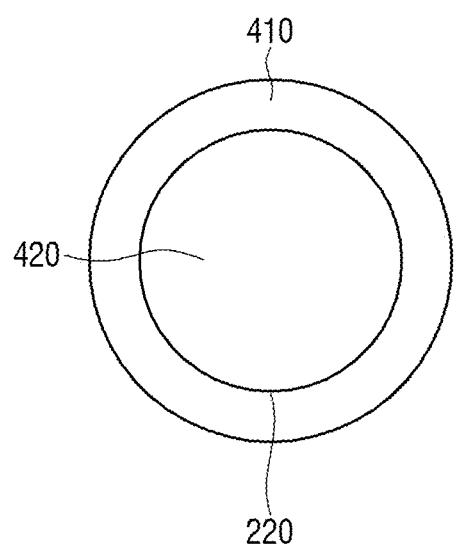

[FIG. 7]
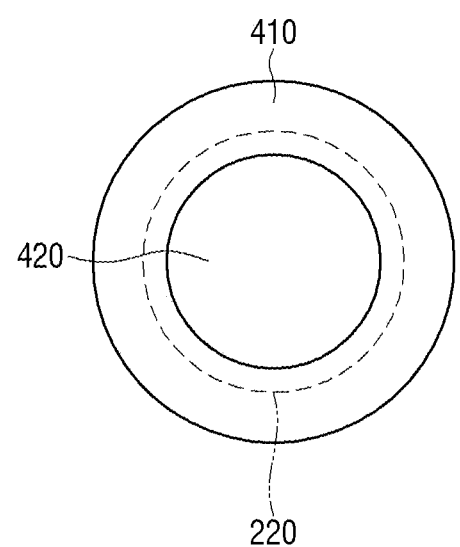

[FIG. 8]
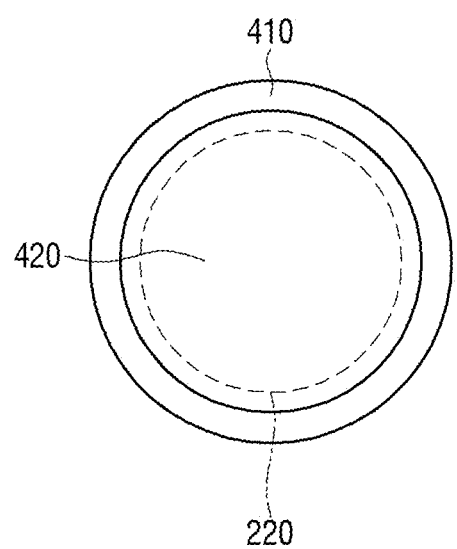

[FIG. 9]
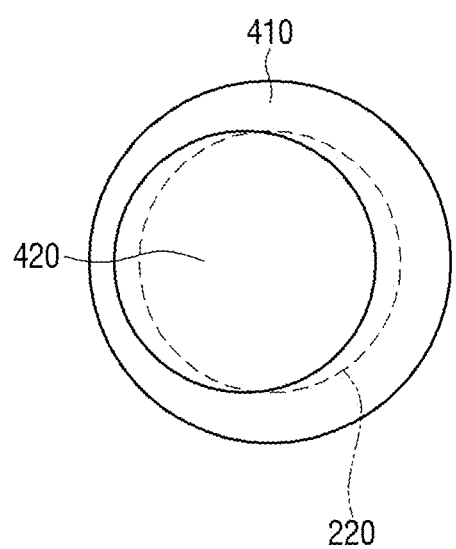

[FIG. 10]
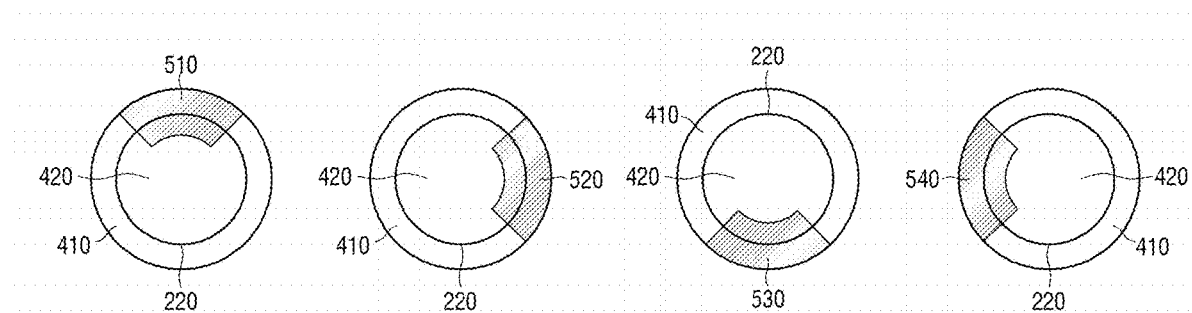

[FIG. 11]
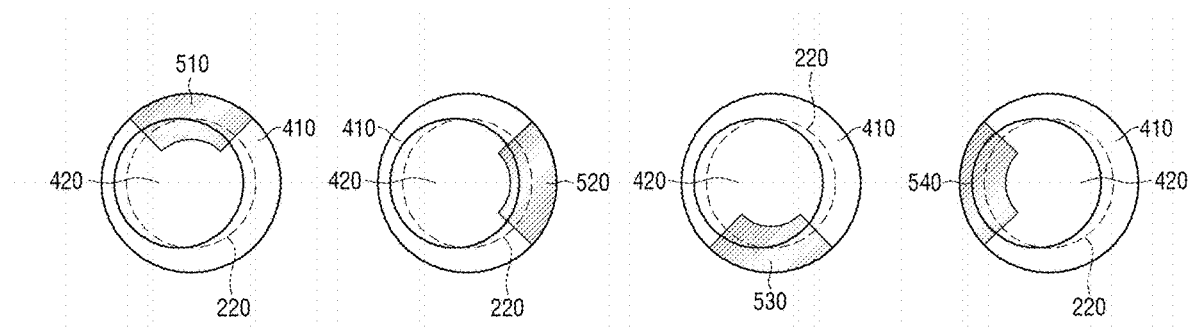

APPARATUS AND METHOD FOR INSPECTING ELECTROSTATIC CHUCK

CROSS-REFERENCE TO RELATED APPLICATION

This application claims priority from Korean Patent Application No. 10-2021-0091872 filed on Jul. 13, 2022, in the Korean Intellectual Property Office, and all the benefits accruing therefrom under 35 U.S.C. 119, the contents of which in its entirety are herein incorporated by reference.

BACKGROUND

Field

The present disclosure relates to an apparatus and method for inspecting an electrostatic chuck. More particularly, the present disclosure relates to an apparatus and method for inspecting a DC electrode installed in a dielectric layer of an electrostatic chuck.

Description of Related Art

A semiconductor device manufacturing process may be continuously performed within a semiconductor device manufacturing facility, and may be divided into a front-end process and a post-end process. The semiconductor device manufacturing facility may be installed in a space defined as a fab to manufacture a semiconductor device.

The front-end process refers to a process that completes a chip by forming a circuit pattern on a wafer. The front-end process may include a deposition process that forms a thin film on the wafer, a photolithography process that transfers a photoresist onto the thin film using a photomask, an etching process that selectively removes a unnecessary portion using chemical substance or reactive gas to form a desired circuit pattern on the wafer, an ashing process that removes the photoresist remaining after the etching, an ion implantation process that implants ions into a portion connected to the circuit pattern to achieve characteristics of an electronic device, and a cleaning process that removes contaminants from the wafer, etc.

The post-end process refers to a process of evaluating performance of the product completed via the front-end process. The post-end process may include a first inspection process that selects good products and defects by inspecting an operation of each chip on the wafer, a package process of cutting and dividing each chip to achieve a product form using dicing, die bonding, wire bonding, molding, marking, etc., a final inspection process to inspect product characteristics and reliability via electrical property inspection, and burn-in inspection, etc.

SUMMARY

When treating a substrate (e.g., a wafer) for manufacturing a semiconductor device, an electrostatic chuck (ESC) for fixing a position of the substrate may be used.

In this electrostatic chuck, a DC electrode may be a key component in determining chucking quality of the substrate. Because the DC electrode is inserted in a ceramic dielectric layer, it is difficult to inspect the DC electrode.

A purpose of the present disclosure is configured to provide an electrostatic chuck inspection apparatus and method for non-destructive inspection of quality of a DC electrode of an electrostatic chuck.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, the signal will be easily understood that the purposes and advantages according to the present disclosure may be realized using means shown in the claims and combinations thereof.

A first aspect of the present disclosure to achieve the purpose provides an apparatus for non-destructive inspection of quality of an electrostatic chuck, the apparatus comprising: a measurement unit for measuring a first capacitance of a dielectric layer of the electrostatic chuck and for measuring a second capacitance of an electrode installed in the dielectric layer; and a control unit configured to evaluate quality of the electrode, based on the first capacitance and the second capacitance.

In one implementation of the first aspect, the control unit evaluates the quality of the electrode based on at least one of an area of the electrode, or whether an arrangement of the electrode with respect to the dielectric layer is asymmetric.

In one implementation of the first aspect, when the control unit evaluates the quality of the electrode based on the area of the electrode, the control unit calculates the area of the electrode and compares the calculation result with a reference value, and evaluate the quality of the electrode based on the comparing result.

In one implementation of the first aspect, the control unit calculates the area of the electrode based on an area of the dielectric layer, the first capacitance, and the second capacitance.

In one implementation of the first aspect, when the control unit calculates the area of the electrode, the control unit further uses a dielectric constant of the dielectric layer and a thickness of the dielectric layer.

In one implementation of the first aspect, the control unit calculates the area of the electrode by multiplying a value obtained by dividing the second capacitance by the first capacitance by the area of the dielectric layer.

In one implementation of the first aspect, the reference value is a size of an area surrounded with the electrode.

In one implementation of the first aspect, the control unit determines that the quality of the electrode is good when the calculation result and the reference value are the same as each other, wherein the control unit determines that the quality of the electrode is defective when the calculation result and the reference value are different from each other.

In one implementation of the first aspect, when the control unit evaluates the quality of the electrode based on both the area of the electrode and whether the arrangement of the electrode with respect to the dielectric layer is asymmetric, the control unit first considers the area of the electrode first, and subsequently, considers whether the arrangement of the electrode with respect to the dielectric layer is asymmetric.

In one implementation of the first aspect, when the control unit determine that the quality of the electrode is good in consideration of the area of the electrode, the control unit evaluates the quality of the electrode again in consideration of whether the arrangement of the electrode with respect to the dielectric layer is asymmetric.

In one implementation of the first aspect, when the control unit evaluates the quality of the electrode based on whether the arrangement of the electrode with respect to the dielectric layer is asymmetric, the control unit divides an area of a top face of the dielectric layer into a plurality of sub-areas, and evaluates the quality of the electrode using a plurality of third capacitances, wherein the plurality of third capacitances correspond to the plurality of sub-areas.

In one implementation of the first aspect, the measurement unit measures the plurality of third capacitances using a metallic plate.

In one implementation of the first aspect, a size of an area of the plate corresponds to a size of each of the sub-areas.

In one implementation of the first aspect, the control unit evaluates the quality of the electrode based on a comparing result between the plurality of third capacitances.

In one implementation of the first aspect, the control unit determines that the quality of the electrode is good when all of the plurality of third capacitances are the same as each other, wherein the control unit determines that the quality of the electrode is defective when at least two of the plurality of third capacitances are different from each other.

In one implementation of the first aspect, when at least two of the plurality of third capacitances are different from each other, the control unit determines that the electrode has moved toward a sub-area having a relatively larger third capacitance such that the arrangement of the electrode with respect to the dielectric layer is asymmetric.

In one implementation of the first aspect, when the measurement unit measures the first capacitance, the measurement unit is connected to a top of the dielectric layer via a first line connected to a first terminal of the measurement unit, and is connected to a bottom of the dielectric layer via a second line connected to a second terminal thereof.

In one implementation of the first aspect, when the measurement unit measures the second capacitance, the measurement unit is connected to a top and a bottom of the dielectric layer via a first line and a second line connected to a first terminal of the measurement unit, respectively, and is connected to a transmission line via a third line connected to a second terminal thereof, wherein the transmission line connects the electrode to a power supply.

A second aspect of the present disclosure to achieve the purpose provides an apparatus for inspection of an electrostatic chuck, the apparatus comprising: a measurement unit for measuring first capacitance of a dielectric layer of the electrostatic chuck and measuring second capacitance of an electrode installed in the dielectric layer; and a control unit configured to evaluate quality of the electrode, based on the first capacitance and the second capacitance, wherein the control unit evaluates the quality of the electrode based on at least one of an area of the electrode or whether an arrangement of the electrode with respect to the dielectric layer is asymmetric, wherein when the control unit evaluates the quality of the electrode based on the area of the electrode, the control unit calculates the area of the electrode based on an area of the dielectric layer, the first capacitance, and the second capacitance, and compares the calculation result with a reference value, and evaluates the quality of the electrode, based on the comparing result, wherein when the control unit evaluates the quality of the electrode based on whether the arrangement of the electrode with respect to the dielectric layer is asymmetric, the control unit divides an area of a top face of the dielectric layer into a plurality of sub-areas, and evaluates the quality of the electrode based on a comparing result between a plurality of third capacitances, wherein the plurality of third capacitances correspond to the plurality of sub-areas.

A third aspect of the present disclosure to achieve the purpose provides a method for non-destructive inspection of quality of an electrostatic chuck, the method comprising: measuring first capacitance of a dielectric layer of the electrostatic chuck; measuring second capacitance of an electrode installed in the dielectric layer; and evaluating quality of the electrode based on the first capacitance and the second capacitance.

Specific details of other embodiments are included in the detailed description and drawings.

BRIEF DESCRIPTION OF DRAWINGS

The above and other aspects and features of the present disclosure will become more apparent by describing in detail illustrative embodiments thereof with reference to the attached drawings, in which:

FIG. 1 is a cross-sectional view schematically showing an internal structure of an apparatus for treating a substrate according to an embodiment;

FIG. 2 is a cross-sectional view schematically showing an internal structure of an apparatus for treating a substrate according to another embodiment;

FIG. 3 is a conceptual diagram schematically illustrating an internal configuration of an electrostatic chuck inspection apparatus according to an embodiment of the present disclosure;

FIG. 4 is an illustrative diagram for illustrating a dielectric layer capacitance measurement method of a measurement unit constituting an inspection apparatus according to an embodiment of the present disclosure;

FIG. 5 is an illustrative diagram for illustrating an electrode capacitance measurement method of a measurement unit constituting an inspection apparatus according to an embodiment of the present disclosure;

FIG. 6 is a first illustrative diagram for illustrating an electrode area inspection method of a control unit constituting an electrostatic chuck inspection apparatus according to an embodiment of the present disclosure;

FIG. 7 is a second illustrative diagram for illustrating an electrode area inspection method of a control unit constituting an electrostatic chuck inspection apparatus according to an embodiment of the present disclosure;

FIG. 8 is a third illustrative view for illustrating an electrode area inspection method of a control unit constituting an electrostatic chuck inspection apparatus according to an embodiment of the present disclosure;

FIG. 9 is a first illustrative diagram for illustrating an electrode asymmetry inspection method of a control unit constituting an electrostatic chuck inspection apparatus according to an embodiment of the present disclosure;

FIG. 10 is a second illustrative diagram for illustrating an electrode asymmetry inspection method of a control unit constituting an electrostatic chuck inspection apparatus according to an embodiment of the present disclosure; and FIG. 11 is a third illustrative diagram for illustrating an electrode asymmetry inspection method of a control unit constituting an electrostatic chuck inspection apparatus according to an embodiment of the present disclosure.

DETAILED DESCRIPTIONS

Advantages and features of the present disclosure, and how to achieve them will become apparent with reference to the embodiments described below in detail in conjunction with the accompanying drawings. However, the present disclosure is not limited to the embodiments as disclosed below, but will be implemented in a variety of different forms. Only these embodiments make the present disclosure complete, and are constructed to fully inform those having common knowledge in the technical field to which the present disclosure belongs of a scope of the disclosure. The scope of the present disclosure is only defined by the scope of the claims.

A shape, a size, a ratio, an angle, a number, etc. disclosed in the drawings for illustrating embodiments of the present disclosure are illustrative, and the present disclosure is not limited thereto. The same reference numerals refer to the same elements herein. Further, in describing the present disclosure, when it is determined that a detailed description of a related known element may unnecessarily obscure gist of the present disclosure, the detailed description thereof will be omitted. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof.

In interpreting a numerical value, the value is interpreted as including an error range unless there is no separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present. In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In descriptions of temporal relationships, for example, temporal precedent relationships between two events such as "after", "subsequent to", "before", etc., another event may occur therebetween unless "directly after", "directly subsequent" or "directly before" is not indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above Equation," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present disclosure relates to an electrostatic chuck inspection apparatus and method for non-destructive inspection of quality of a DC electrode (that is, an ESC DC electrode) of an electrostatic chuck. First, an apparatus for treating a substrate on which an electrostatic chuck is installed will be described.

FIG. 1 is a cross-sectional view schematically showing an internal structure of an apparatus for treating a substrate according to an embodiment.

According to FIG. 1, an apparatus 100 for treating the substrate may be configured to include a housing 110, a substrate support unit 120, a plasma generating unit 130, a shower head unit 140, a first gas supply unit 150, a second gas supply unit 160, a liner unit 170, a baffle unit 180 and an top module 190.

The apparatus 100 for treating a substrate may be configured to treat a substrate W, for example, a wafer using a dry etching process in a vacuum environment. The apparatus 100 for treating a substrate may treat the substrate W, for example, using a plasma process, and may be implemented as an etching process chamber, a cleaning process chamber, and the like.

The housing 110 is configured to provide a space where the plasma process is performed. The housing 110 may have an exhaust hole 111 defined at a bottom thereof.

The exhaust hole 111 may be connected to an exhaust line 113 equipped with a pump 112. The exhaust hole 111 may discharge reaction by-products generated in the plasma process and gas remaining inside the housing 110 out of the housing 110 through the exhaust line 113. In this case, an inner space of the housing 110 may be depressurized to a predetermined pressure.

The housing 110 may have an opening 114 formed in a sidewall thereof. The opening 114 may function as a passage through which the substrate W enters and exits an interior of the housing 110. The opening 114 may be configured to be opened and closed by a door assembly 115.

The door assembly 115 may be configured to include an outer door 115a and a door driver 115b. The outer door 115a is provided at an outer wall of the housing 110. The outer door 115a may move in an up-down direction, that is, in a third direction 30 under an operation of the door driver 115b. The door driver 115b may operate using a motor, a hydraulic cylinder, or a pneumatic cylinder.

The substrate support unit 120 is configured to be installed in a lower area of the inner space of the housing 110. The substrate support unit 120 may support the substrate W using an electrostatic force. However, the present embodiment is not limited thereto. The substrate support unit 120 is also capable of supporting the substrate W in various ways, for example, in a mechanical clamping manner, a vacuum manner, and the like.

When the substrate support unit 120 supports the substrate W using the electrostatic force, the unit 120 may be configured to include a base 121 and a electrostatic chuck (ESC) 122.

The electrostatic chuck 122 refers to a substrate support member that supports the substrate W seated thereon using the electrostatic force. The electrostatic chuck 122 may be made of a ceramic material, and may be coupled to the base 121 so as to be fixed on the base 121.

The electrostatic chuck 122 may be installed to be movable in the vertical direction, that is, in the third direction 30, inside the housing 110 using a driving member (not shown). When the electrostatic chuck 122 is configured to be movable in the vertical direction in this way, the chuck 122 may position the substrate W in an area in which a more uniform plasma distribution is achieved.

A ring assembly 123 is configured to enclose a rim of the electrostatic chuck 122. This ring assembly 123 may be provided in a ring shape, and may be configured to support an edge area of the substrate W. The ring assembly 123 may be configured to include a focus ring 123a and an insulator ring 123b.

The focus ring 123a is disposed inwardly of the insulator ring 123b and is configured to surround the electrostatic chuck 122. This focus ring 123a may be made of a silicon material, and may concentrate ions generated during the plasma process onto the substrate W.

The insulator ring 123b is disposed outwardly of the focus ring 123a and is configured to surround the focus ring 123a. The insulator ring 123b may be made of a quartz material.

In one example, the ring assembly 123 may further include an edge ring (not shown) that is formed in close contact with an edge of the focus ring 123a. The edge ring may be formed to prevent damage to a side face of the electrostatic chuck 122 under influence of the plasma.

The first gas supply unit 150 supplies first gas to remove foreign substance remaining on a top face of the ring assembly 123 or on the rim of the electrostatic chuck 122. The first gas supply unit 150 may be configured to include a first gas supply source 151 and a first gas supply line 152.

The first gas supply source 151 may supply nitrogen gas ($N_2$ gas) as the first gas. However, the present embodiment is not limited thereto. The first gas supply source 151 may also supply other gases or cleaning agents.

The first gas supply line 152 is provided between the electrostatic chuck 122 and the ring assembly 123. The first gas supply line 152 may be configured to be connected to and disposed between the electrostatic chuck 122 and the focus ring 123a, in one example.

In one example, the first gas supply line 152 may be received inside the focus ring 123a and may be bent so as to be connected to between the electrostatic chuck 122 and the focus ring 123a.

A heating member 124 and a cooling member 125 are provided so that the substrate W may maintain a process temperature while an etching process is in progress inside the housing 110. For this purpose, the heating member 124 may be embodied as a heating wire, and the cooling member 125 may be embodied as a cooling line through which a refrigerant flows.

The heating member 124 and the cooling member 125 may be installed inside the substrate support unit 120 to allow the substrate W to maintain the process temperature. In one example, the heating member 124 may be installed inside the electrostatic chuck 122, and the cooling member 125 may be installed inside the base 121.

In one example, the cooling member 125 may receive the refrigerant using a chiller 126. The chiller 126 may be installed outside the housing 110.

The plasma generating unit 130 generates plasma from the gas remaining in a discharge space. In this regard, the discharge space means a space located above the substrate support unit 120 and in the inner space of the housing 110.

The plasma generating unit 130 may generate the plasma in the discharge space inside the housing 110 using an inductively coupled plasma (ICP) source. In this case, the plasma generating unit 130 may use an antenna unit 193 installed on the top module 190 as an upper electrode, and may use the electrostatic chuck 122 as a lower electrode.

However, the present embodiment is not limited thereto. The plasma generating unit 130 generate the plasma in the discharge space inside the housing 110 using a capacitively coupled plasma (CCP) source. In this case, the plasma generating unit 130 may use the shower head unit 140 as the upper electrode and the electrostatic chuck 122 as the lower electrode as shown in FIG. 2. FIG. 2 is a cross-sectional view schematically showing an internal structure of an apparatus for treating a substrate according to another embodiment.

Reference to FIG. 1 will be made again for following description.

The plasma generating unit 130 may be configured to include the upper electrode, the lower electrode, an upper power supply 131 and a lower power supply 133.

The upper power supply 131 applies power to the upper electrode, that is, the antenna unit 193. The upper power supply 131 may be configured to control plasma characteristics. The upper power supply 131 may be configured to adjust, for example, ion bombardment energy.

Although a single upper power supply 131 is shown in FIG. 1, a plurality of upper power supplies 131 may be provided in this embodiment. When the plurality of upper power supplies 131 are provided, the apparatus 100 for treating a substrate may further include a first matching network (not shown) electrically connected to the plurality of upper power supplies.

The first matching network may match frequency powers of different magnitudes input respectively from the upper power supplies with each other and apply the matching result to the antenna unit 193.

In one example, for the purpose of impedance matching, the first impedance matching circuit (not shown) may be disposed on a first transmission line 132 for connecting the upper power supply 131 and the antenna unit 193 to each other.

The first impedance matching circuit may act as a lossless passive circuit to effectively (that is, to at maximum level) transfer electrical energy from the upper power supply 131 to the antenna unit 193.

The lower power supply 133 applies power to the lower electrode, that is, the electrostatic chuck 122. The lower power supply 133 may serve as a plasma source for generating plasma, or may serve to control characteristics of the plasma together with the upper power supply 131.

Although a single lower power supply 133 is shown in FIG. 1, a plurality of lower power supplies 133 may be provided in this embodiment in the same manner as the upper power supply 131. When the plurality of lower power supplies 133 are provided, a second matching network (not shown) electrically connected to the plurality of lower power supplies may be further included.

The second matching network may match different magnitudes of frequency powers input respectively from the lower power supplies and apply the matching result to the electrostatic chuck 122.

In one example, for the purpose of impedance matching, the second impedance matching circuit (not shown) may be disposed on a second transmission line 134 for connecting the lower power supply 133 and the electrostatic chuck 122 to each other.

The second impedance matching circuit may act as a lossless passive circuit as the first impedance matching circuit may, so that electric energy may be effectively (that is, maximally) transferred from the lower power supply 133 to the electrostatic chuck 122.

The shower head unit 140 may include a lower shower head unit installed inside the electrostatic chuck 122 so as to face upwardly, and an upper shower head unit installed inside a top space of the housing 110 so as to face downwardly. This shower head unit 140 may have a plurality of gas feeding holes to inject gas into the interior of the housing 110, and may be configured to have a larger diameter than that of the electrostatic chuck 122. In one example, the shower head unit 140 may be made of a silicon material or a metal material.

The second gas supply unit 160 supplies process gas (second gas) to the inside of the housing 110 through the shower head unit 140. The second gas supply unit 160 may include a second gas supply source 161 and a second gas supply line 162.

The second gas supply source 161 is configured to supply, as the process gas, cleaning gas used for treating the substrate W, the interior of the housing 110, and the like. The second gas supply source 161 is also capable of supplying etching gas used for treating the substrate W as the process gas.

The second gas supply source 161 may be embodied as a single unit so as to supply the process gas to the shower head unit 140. However, the present embodiment is not limited thereto. The second gas supply source 161 may be embodied as a plurality of units so as to supply the process gas to the shower head unit 140.

The second gas supply line 162 is configured to connect the second gas supply source 161 and the shower head unit 140 to each other. The second gas supply line 162 transfers the process gas supplied through the second gas supply source 161 to the shower head unit 140 so that the process gas may be introduced into the housing 110.

In one example, when the shower head unit 140 is divided into a center area, a middle area, an edge area, etc., the second gas supply unit 160 may be configured to further include a gas distributor (not shown) and a gas distribution line (not shown) to supply the process gas to each of the areas of the shower head unit 140.

The gas distributor distributes the process gas supplied from the second gas supply source 161 to each of the areas of the shower head unit 140. This gas distributor may be connected to the second gas supply source 161 through the second gas supply line 162.

The gas distribution line connects the gas distributor and each of the areas of the shower head unit 140 to each other. The gas distribution line may transfer the process gas distributed via the gas distributor to each of the areas of the shower head unit 140.

The liner unit 170 is referred to as a wall liner and is configured to protect an inner face of the housing 110 from are discharge generated during excitation of the process gas, impurities generated during the substrate treating process, and the like. This liner unit 170 may be provided inside the housing 110 and have a cylindrical shape having open top and bottom.

The liner unit 170 may be disposed adjacent to an inner wall of the housing 110. This liner unit 170 may have a support ring 171 at a top thereof. The support ring 171 protrudes outwardly (that is, in a first direction 10) from the top of the liner unit 170, and is placed on an upper end of the housing 110 to support the liner unit 170.

The baffle unit 180 serves to exhaust by-products and unreacted gases during the plasma process. This baffle unit 180 may be installed between the inner wall of the housing 110 and the substrate support unit 120.

The baffle unit 180 may be provided in an annular ring shape, and may include a plurality of through holes extending therethrough in the vertical direction, that is, the third direction 30. The baffle unit 180 may control flow of the process gas based on the number and shapes of the through holes.

In this embodiment, the baffle unit 180 may have a double structure, and may move vertically. A more detailed description of the baffle unit 180 will be made later.

The top module 190 is installed to cover an open top of the housing 110. The top module 190 may include a window member 191, an antenna member 192, and the antenna unit 193.

The window member 191 is formed to cover the top of the housing 110 in order to seal the inner space of the housing 110. The window member 191 may be provided in a shape of a plate, for example, a disk, and may be made of an insulating material, for example, alumina ($Al_2O_3$).

The window member 191 may be formed to include a dielectric window. The window member 191 may have a hole through defined therein into which the second gas supply line 162 is inserted. A coating film may be formed on a surface of the member 191 so as to suppress occurrence of particles therefrom when the plasma process is performed inside the housing 110.

The antenna member 192 may be installed on a top face of the window member 191 and may have a space of a predetermined size defined therein so that the antenna unit 193 may be received in the space.

The antenna member 192 may be formed in a cylindrical shape with an open bottom, and may be configured to have a diameter corresponding to that of the housing 110. The antenna member 192 may be configured to be detachable from the window member 191.

The antenna unit 193 serves as the upper electrode and may include a coil configured to form a closed loop. This antenna unit 193 generates a magnetic field and an electric field inside the housing 110 based on the power supplied from the upper power supply 131, and thus excites the gas introduced into the housing 110 through the shower head unit 140 into the plasma.

The antenna unit 193 may include the coil in a form of a planar spiral. However, the present embodiment is not limited thereto. A structure or a size of the coil may be variously modified by a person skilled in the art.

Next, an apparatus and a method for non-destructive inspection of quality of a DC electrode 220 of the electrostatic chuck 122 will be described.

The electrostatic chuck 122 may fix the position of the substrate W by chucking the substrate W when the apparatus 100 for treating the substrate treats the substrate, for example, a wafer W. At this time, the DC electrode 220 may be inserted into a dielectric layer made of a ceramic material constituting the electrostatic chuck 122 and may participate in the chucking of the substrate W. In other words, the DC electrode 220 may be a key component in determining the quality of the chucking of the substrate W (wafer W).

However, as described above Equation, since the DC electrode 220 is inserted into the dielectric layer made of the ceramic material, it is difficult to inspect the electrode 220. Hereinafter, in order to solve this problem, an apparatus and a method for non-destructive inspection of quality of the DC electrode 220 will be described.

FIG. 3 is a conceptual diagram schematically illustrating an internal configuration of an electrostatic chuck inspection apparatus according to an embodiment of the present disclosure.

According to FIG. 3, an inspection apparatus 300 may be configured to include a measurement unit 310 and a control unit 320.

The inspection apparatus 300 may perform a non-destructive inspection of quality of the DC electrode 220 of the electrostatic chuck 122 based on a measuring result of capacitance. Specifically, the inspection apparatus 300 may perform the non-destructive inspection on quality of the DC electrode 220 using an electrode area inspection method, an electrode asymmetry inspection method, or the like.

The measurement unit 310 measures the capacitance. This measurement unit 310 may measure capacitance of the dielectric layer 210 of the electrostatic chuck 122 and may measure capacitance of the DC electrode 220 installed in the dielectric layer 210 of the electrostatic chuck 122.

When measuring the capacitance of the dielectric layer 210, the measurement unit 310 may be connected to a top and a bottom of the dielectric layer 210 through a first line 331 and a second line 332, respectively, as shown in FIG. 4. In this regard, the first line 331 may be connected to a first terminal 341 of the measurement unit 310 while the second line 332 may be connected to a second terminal 342 of the measurement unit 310. FIG. 4 is an illustrative diagram for illustrating a dielectric layer capacitance measurement method of a measurement unit constituting an inspection apparatus according to an embodiment of the present disclosure.

When measuring the capacitance of the DC electrode 220, the measurement unit 310 may be connected to a top and a bottom of the dielectric layer 210 and a second transmission line 134 connecting the DC electrode 220 and the lower power supply 133 to each other via the first line 331, the second line 332 and a third line 333 as shown in FIG. 5, respectively. The first line 331 and the second line 332 may be connected to the first terminal 341 of the measurement unit 310, and the third line 333 may be connected to the second terminal 342 of the measurement unit 310. FIG. 5 is an illustrative diagram for illustrating an electrode capacitance measurement method of a measurement unit constituting an inspection apparatus according to an embodiment of the present disclosure.

Reference to FIG. 3 will be made again for following description.

The inspection apparatus 300 includes a single measurement unit 310. In this case, the single measurement unit 310 may measure both the capacitance of the dielectric layer 210 and the capacitance of the DC electrode 220. The measurement unit 310 may measure one of the capacitance of the dielectric layer 210 and the capacitance of the DC electrode 220, and then, measure the other thereof. However, the present embodiment is not limited thereto.

The inspection apparatus 300 includes two measurement units 310, wherein one of the two measurement units 310 measures capacitance of the dielectric layer 210, and the other measurement unit 310 measures the capacitance of the DC electrode 220. When the inspection apparatus 300 includes the two measurement units 310, the capacitance of the dielectric layer 210 and the capacitance of the DC electrode 220 may be simultaneously measured.

In one example, measurement unit 310 may be implemented as an LCR tester that may measure inductance, capacitance, and resistance. The measurement unit 310 may also be implemented as an LCR meter.

The control unit 320 is configured to evaluate the quality of the DC electrode 220. The control unit 320 may evaluate the quality of the DC electrode 220 based on the capacitance of the dielectric layer 210 and the capacitance of the DC electrode 220.

The control unit 320 may determine the quality of the DC electrode 220 using an electrode area inspection method, an electrode asymmetry inspection method, or the like. A detailed description of the electrode area inspection method, the electrode asymmetry inspection method, etc. will be made later.

The control unit 320 may be implemented as a computer or a server including a process controller, a control program, an input module, an output module (or a display module), a memory module, and the like. In the above description, the process controller may include a microprocessor executing a control function, and the control program may execute various treatments under control of the process controller. The memory module may store therein a program (that is, a treating recipe) for executing various treatments according to various data and treatment conditions. In one example, the control unit 320 may be implemented as a microprocessor.

Next, the electrode area inspection method will be described.

When manufacturing the electrostatic chuck 122, a thickness and permittivity of the dielectric layer 210 may fluctuate. Therefore, in this embodiment, for accurate area calculation, capacitance of an entire dielectric zone and capacitance of an electrode zone may be sequentially measured, and an area ratio between the area of the entire dielectric zone and an area of the electrode zone may be calculated based on the measurements.

The control unit 320 may calculate the area of the DC electrode 220 based on the measurement result of the measurement unit 310. Specifically, the control unit 320 may calculate the area of the DC electrode 220 based on the capacitance of the dielectric layer 210 and the capacitance of the DC electrode 220. The control unit 320 may calculate the area of the DC electrode 220 using a following Equation 1.

$$A_{Electrode} = A_{Total} \times \frac{C_{Electrode}}{C_{Total}} \quad \text{Equation 1}$$

In the above Equation, $A_{Electrode}$ means the area of the DC electrode 220, that is, the area of the electrode zone, and $A_{Total}$ means the area of the dielectric layer 210, that is, the area of the entire dielectric zone. Further, $C_{Electrode}$ means the capacitance of the DC electrode 220, and $C_{Total}$ means the capacitance of the dielectric layer 210.

In one example, since the dielectric layer 210 is exposed to the outside, the area of the dielectric layer 210 may be measured in a non-destructive manner. The area of the dielectric layer 210 may be measured in advance or may be measured when the measurement unit 310 measures the capacitance of the dielectric layer 210 and the capacitance of the DC electrode 220.

In one example, a result of the Equation 1 may be obtained by sequentially applying following Equation 2 to Equation 5.

$$C_{Total} = \varepsilon \frac{A_{Total}}{D} \to A_{Total} = \frac{C_{Total}D}{\varepsilon} \quad \text{Equation 2}$$

In the above Equation, c means a dielectric constant of the dielectric layer 210, D means a thickness of the dielectric layer 210.

$$C_{Electrode} = \varepsilon \frac{A_{Electrode}}{D} \to A_{Electrode} = \frac{C_{Electrode}D}{\varepsilon} \quad \text{Equation 3}$$

$$A_{Total} : A_{Electrode} = \frac{C_{Total}D}{\varepsilon} : \frac{C_{Electrode}D}{\varepsilon} \quad \text{Equation 4}$$

$$A_{Electrode} \times \frac{C_{Total}\cancel{D}}{\cancel{\varepsilon}} = A_{Total} \times \frac{C_{Electrode}\cancel{D}}{\cancel{\varepsilon}} \quad \text{Equation 5}$$

When the area of the DC electrode 220 has been calculated through the Equation 1, the control unit 320 may determine the quality of the DC electrode 220 based on a comparing result of the calculation result with a reference value. In this regard, the reference value refers to a specification thereof in a manufacturing process of the electrostatic chuck 122, and may be pre-stored in the memory module of the control unit 320. The reference value may be a size of an area surrounded with the DC electrode 220 during manufacturing of the electrostatic chuck 122.

When the calculation result (that is, the area of the DC electrode 220 calculated through Equation 1) is the same as the reference value, an area 420 of the DC electrode 220 with respect to an area 410 of the dielectric layer 210 coincides with a position of the DC electrode 220 within the dielectric layer 210 as shown in FIG. 6. Accordingly, the control unit 320 may determine that the quality of the DC electrode 220 is good. FIG. 6 is a first illustrative diagram for illustrating the electrode area inspection method of the control unit constituting the electrostatic chuck inspection apparatus according to an embodiment of the present disclosure.

On the contrary, when the calculation result is not the same as the reference value, the control unit 320 may determine that the quality of the DC electrode 220 is defective. For example, when the calculation result is smaller than the reference value, the area 420 of the DC electrode 220 with respect to the area 410 of the dielectric layer 210 is located inwardly of the position of the DC electrode 220 installed in the dielectric layer 210 as shown in FIG. 7. In this case, since a He leak phenomenon may occur due to decrease in the wafer chucking force, the control unit 320 may determine that the quality of the DC electrode 220 is defective. FIG. 7 is a second illustrative diagram for illustrating the electrode area inspection method of the control unit constituting the electrostatic chuck inspection apparatus according to an embodiment of the present disclosure.

In one example, when the calculation result is larger than the reference value, the area 420 of the DC electrode 220 with respect to the area 410 of the dielectric layer 210 is located outwardly of the position of the DC electrode 220 installed in the dielectric layer 210 as shown in FIG. 8. In this case, since a wafer decay defect may occur due to increase in the wafer chucking force, the control unit 320 may determine that the quality of the DC electrode 220 is defective. FIG. 8 is a third illustrative diagram for illustrating the electrode area inspection method of the control unit constituting the electrostatic chuck inspection apparatus according to an embodiment of the present disclosure.

In one example, even when the calculation result is the same as the reference value, the area 420 of the DC electrode 220 with respect to the area 410 of the dielectric layer 210 may not coincide with the location of the DC electrode 220 installed in the dielectric layer 210 as shown in FIG. 9. That is, an electrode asymmetry phenomenon may occur. In this case, the He Leak phenomenon may occur due to non-uniformity of the wafer chucking force.

In this embodiment, the control unit 320 may inspect the quality of the DC electrode 220 using the electrode asymmetry inspection method in consideration of the above problem.

FIG. 9 is the first illustrative diagram for illustrating an electrode asymmetry inspection method of a control unit constituting an electrostatic chuck inspection apparatus according to an embodiment of the present disclosure.

Next, an electrode asymmetry inspection method will be described.

The measurement unit 310 may divide an edge area of the dielectric layer 210 into a plurality of local areas and may measure capacitance of each of the local areas. In this case, the measurement unit 310 may measure the capacitance of each of the local areas of the dielectric layer 210 using a metallic plate (that is, the metallic plate having an area that may allow only a local area of the ESC edge area to be measured).

The metallic plate refers to a flat metal plate and may have a size corresponding to a local area of the dielectric layer 210. That is, when capacitance of each local area of the dielectric layer 210 is measured, the metallic plate is in contact with the corresponding local area of the dielectric layer 210, and the measurement unit 310 is connected to the metallic plate through the first line 331, and is connected to a bottom of the dielectric layer 210 through the second line 332. Thus, the capacitance of the corresponding local area of the dielectric layer 210 may be measured.

The control unit 320 may determine the quality of the DC electrode 220 based on a comparing result of capacitances of the plurality of local areas. In this regard, the plurality of local areas may have the same size.

Hereinafter, a method of determining the quality of the DC electrode 220 will be described using an example in which the edge area of the dielectric layer 210 is divided into four local areas.

FIG. 10 is a second illustrative diagram for illustrating an electrode asymmetry inspection method of a control unit constituting an electrostatic chuck inspection apparatus according to an embodiment of the present disclosure. FIG. 11 is a third illustrative diagram for illustrating an electrode asymmetry inspection method of a control unit constituting an electrostatic chuck inspection apparatus according to an embodiment of the present disclosure.

The measurement unit 310 measures capacitance of each of a first area 510, a second area 520, a third area 530 and a fourth area 540. In this case, the capacitance of the first area 510, the capacitance of the second area 520, the capacitance of the third area 530, and the capacitance of the fourth area 540 are defined as A, B, C, and D, respectively.

As shown in FIG. 6, when an arrangement of the electrode is symmetrical, the capacitances of the local areas are the same as each other. Therefore, as shown in FIG. 10, the capacitances A, B, C, and D of the four areas 510, 520, 530, and 540 are the same as each other (A=B=C=D). Thus, in this case, the control unit 320 may determine that the DC electrode 220 has good quality.

On the contrary, as shown in FIG. 9, when the arrangement of the electrode is asymmetric, a difference between the capacitances of the local areas may occur. Accordingly, since all of the capacitances A, B, C, and D of the four areas 510, 520, 530, and 540 are equal to each other, the control unit 320 may determine that the quality of the DC electrode 220 is defective in this case.

In one example, when the arrangement of the electrode is asymmetric and the capacitance value difference occurs, it may be estimated that the electrode moves to a position with a higher capacitance value such that the arrangement of the electrode with respect to the dielectric layer is asymmetrical. For example, as shown in FIG. 11, when the capacitance D of the fourth area 540 is relatively larger and the capacitance B of the second area 520 is relatively smallest (D>A=C>B), the control unit 320 may estimate that the electrode moves toward the fourth area 540 such that the arrangement of the electrode with respect to the dielectric layer is asymmetrical.

The electrostatic chuck inspection apparatus 300 and the method using the same according to an embodiment of the present disclosure have been described above with reference to FIGS. 1 to 11. The present disclosure is directed to a non-destructive inspection apparatus and method of the quality of the ESC DC electrode 220 which may identify a size of the DC electrode 220 and whether the arrangement of the electrode with respect to the dielectric layer is asymmetrical, based on the capacitance measurement.

In the electrode area inspection method, the capacitance of the entire ESC dielectric zone, the capacitance of the DC electrode zone, and the dielectric layer area may be measured. Based on the measured results, the area of the DC electrode inserted into the ESC dielectric may be derived. Then, the quality of the electrode may be determined based on the derivation result.

Further, in the electrode asymmetry inspection method, the capacitance of each local area may be measured using the metallic plate having the area corresponding to only the local area of the ESC edge area. The measured results are compared with each other. The method may determine whether the arrangement of the electrode with respect to the dielectric layer is asymmetrical, based on the comparing result. Then, the quality of the electrode may be determined based on the determination result. Whether the arrangement of the electrode with respect to the dielectric layer is symmetrical, the capacitances of the local areas are the same as each other, When the arrangement of the electrode with respect to the dielectric layer is asymmetrical, the capacitance value difference occurs. Thus, it may be estimated that the electrode moves to a position with a higher capacitance value such that the arrangement of the electrode with respect to the dielectric layer is asymmetrical.

Although the embodiments of the present disclosure have been described with reference to the above descriptions and the accompanying drawings, those of ordinary skill in the art to which the present disclosure pertains may appreciate that the present disclosure may be practiced in another specific form without changing its technical idea or essential characteristics. Therefore, it should be understood that the embodiments as described above are illustrative and not restrictive in all respects.

What is claimed is:

1. An apparatus for non-destructive inspection of quality of an electrostatic chuck, the apparatus comprising:
   a measurement unit for measuring a first capacitance of a dielectric layer of the electrostatic chuck and for measuring a second capacitance of an electrode installed in the dielectric layer; and
   a control unit configured to evaluate quality of the electrode, based on the first capacitance and the second capacitance.

2. The apparatus of claim 1, wherein the control unit evaluates the quality of the electrode based on at least one of an area of the electrode, or whether an arrangement of the electrode with respect to the dielectric layer is asymmetric.

3. The apparatus of claim 2, wherein when the control unit evaluates the quality of the electrode based on the area of the electrode, the control unit calculates the area of the electrode and compares the calculation result with a reference value, and evaluate the quality of the electrode based on the comparing result.

4. The apparatus of claim 1, wherein the control unit is configured to calculate an area of the electrode based on an area of the dielectric layer, the first capacitance of the dielectric layer, and the second capacitance of the electrode.

5. The apparatus of claim 4, wherein when the control unit calculates the area of the electrode, the control unit further uses a dielectric constant of the dielectric layer and a thickness of the dielectric layer.

6. The apparatus of claim 4, wherein the control unit calculates the area of the electrode by multiplying a value obtained by dividing the second capacitance by the first capacitance by the area of the dielectric layer.

7. The apparatus of claim 3, wherein the reference value is a size of an area surrounded with the electrode.

8. The apparatus of claim 3, wherein the control unit determines that the quality of the electrode is good when the calculation result and the reference value are the same as each other, wherein the control unit determines that the quality of the electrode is defective when the calculation result and the reference value are different from each other.

9. The apparatus of claim 1, wherein the control unit is configured to first consider an area of the electrode first, and subsequently, consider whether an arrangement of the electrode with respect to the dielectric layer is asymmetric.

10. The apparatus of claim 9, wherein when the control unit determine that the quality of the electrode is good in consideration of the area of the electrode, the control unit evaluates the quality of the electrode again in consideration of whether the arrangement of the electrode with respect to the dielectric layer is asymmetric.

11. The apparatus of claim 1, wherein the control unit is configured to divide an area of a top face of the dielectric layer into a plurality of sub-areas, and evaluate the quality of the electrode using a plurality of third capacitances, wherein the plurality of third capacitances correspond to the plurality of sub-areas.

12. The apparatus of claim 11, wherein the measurement unit measures the plurality of third capacitances using a metallic plate.

13. The apparatus of claim 12, wherein a size of an area of the plate corresponds to a size of each of the sub-areas.

14. The apparatus of claim 11, wherein the control unit evaluates the quality of the electrode based on a comparing result between the plurality of third capacitances.

15. The apparatus of claim 14, wherein the control unit determines that the quality of the electrode is good when all of the plurality of third capacitances are the same as each other,
wherein the control unit determines that the quality of the electrode is defective when at least two of the plurality of third capacitances are different from each other.

16. The apparatus of claim 15, wherein when at least two of the plurality of third capacitances are different from each other, the control unit determines that the electrode has moved toward a sub-area having a relatively larger third capacitance such that the arrangement of the electrode with respect to the dielectric layer is asymmetric.

17. The apparatus of claim 1, wherein when the measurement unit measures the first capacitance, the measurement unit is connected to a top of the dielectric layer via a first line connected to a first terminal of the measurement unit, and is connected to a bottom of the dielectric layer via a second line connected to a second terminal thereof.

18. The apparatus of claim 1, wherein when the measurement unit measures the second capacitance, the measurement unit is connected to a top and a bottom of the dielectric layer via a first line and a second line connected to a first terminal of the measurement unit, respectively, and is connected to a transmission line via a third line connected to a second terminal thereof, wherein the transmission line connects the electrode to a power supply.

19. An apparatus for inspection of an electrostatic chuck, the apparatus comprising:
a measurement unit for measuring first capacitance of a dielectric layer of the electrostatic chuck and measuring second capacitance of an electrode installed in the dielectric layer; and
a control unit configured to evaluate quality of the electrode, based on the first capacitance and the second capacitance,
wherein the control unit evaluates the quality of the electrode based on at least one of an area of the electrode or whether an arrangement of the electrode with respect to the dielectric layer is asymmetric,
wherein when the control unit evaluates the quality of the electrode based on the area of the electrode, the control unit calculates the area of the electrode based on an area of the dielectric layer, the first capacitance, and the second capacitance, and compares the calculation result with a reference value, and evaluates the quality of the electrode, based on the comparing result,
wherein when the control unit evaluates the quality of the electrode based on whether the arrangement of the electrode with respect to the dielectric layer is asymmetric, the control unit divides an area of a top face of the dielectric layer into a plurality of sub-areas, and evaluates the quality of the electrode based on a comparing result between a plurality of third capacitances, wherein the plurality of third capacitances correspond to the plurality of sub-areas.

20. A method for non-destructive inspection of quality of an electrostatic chuck, the method comprising:
measuring first capacitance of a dielectric layer of the electrostatic chuck;
measuring second capacitance of an electrode installed in the dielectric layer; and
evaluating quality of the electrode based on the first capacitance and the second capacitance.

* * * * *